US011115057B2

(12) United States Patent
Danilov et al.

(10) Patent No.: US 11,115,057 B2
(45) Date of Patent: Sep. 7, 2021

(54) EFFICIENT ERASURE CODING OF MID-SIZE DATA OBJECTS

(71) Applicant: EMC IP Holding Company LLC, Hopkinton, MA (US)

(72) Inventors: Mikhail Danilov, Saint Petersburg (RU); Konstantin Buinov, Prague (CZ)

(73) Assignee: EMC IP HOLDING COMPANY LLC, Hopkinton, MA (US)

(*) Notice: Subject to any disclaimer, the term of this patent is extended or adjusted under 35 U.S.C. 154(b) by 0 days.

(21) Appl. No.: 16/784,516

(22) Filed: Feb. 7, 2020

(65) Prior Publication Data
US 2021/0250048 A1    Aug. 12, 2021

(51) Int. Cl.
H03M 13/00      (2006.01)
H03M 13/15      (2006.01)
G06F 11/10      (2006.01)

(52) U.S. Cl.
CPC ....... *H03M 13/154* (2013.01); *G06F 11/1076* (2013.01)

(58) Field of Classification Search
None
See application file for complete search history.

(56) References Cited

U.S. PATENT DOCUMENTS

| 2014/0122441 | A1* | 5/2014 | Vervaet | G06F 11/1076 707/687 |
| 2017/0060683 | A1* | 3/2017 | Luby | G06F 3/067 |
| 2018/0101462 | A1* | 4/2018 | De Schrijver | G06F 11/1076 |
| 2019/0155708 | A1* | 5/2019 | Yoon | H03M 13/154 |

OTHER PUBLICATIONS

B. Kulkarni and V. Bhosale, "Efficient storage utilization using erasure codes in OpenStack cloud," 2016 International Conference on Inventive Computation Technologies (ICICT), 2016, pp. 1-5, doi: 10.1109/INVENTIVE.2016.7830245. (Year: 2016).*

* cited by examiner

*Primary Examiner* — Daniel F. McMahon
(74) *Attorney, Agent, or Firm* — Amin, Turocy & Watson, LLP

(57) ABSTRACT

The disclosed technology generally describes a data protection scheme that for "mid-size" objects directly writes divided object data fragments, and performs erasure coding to directly write object coding fragments, to distributed storage locations in a node cluster. A storage container such as a chunk allocated for mid-size objects is distributed among the storage cluster nodes. When a mid-size object (e.g., between 24 megabytes and 128 megabytes) is to be created, the object data is divided into object data fragments and encoded into object coding fragments, with the data object fragments and object coding fragments written/appended to the distributed storage locations, without needing a preliminary protection scheme.

20 Claims, 11 Drawing Sheets

EFFICIENT ERASURE CODING OF MID-SIZE DATA OBJECTS

TECHNICAL FIELD

The subject application generally relates to storing data in data storage systems, and more particularly to a technology for storing mid-size objects in a data protected way via erasure coding, and without the need to apply a preliminary protection scheme, and related embodiments.

BACKGROUND

Contemporary cloud-based data storage systems, such as ECS (formerly known as ELASTIC CLOUD STORAGE) provided by DELL EMC, can be based on a cluster of nodes that each owns some part of the stored data (and can store redundant data and/or erasure coded data for data protection purposes) in storage devices. In ECS, disk space is partitioned into a set of blocks referred to as chunks, which for example can be a fixed size of 128 MB. User data objects are stored in chunks, and a data object of typical size ordinarily comprises a set of segments stored to different chunks. The chunks are shared, in that a chunk typically contains segments of multiple, different user objects.

Chunk content is modified in append-only mode. When a chunk becomes full enough, the chunk gets sealed and can no longer be written to with further data. The content of a sealed chunk is immutable.

ECS is a reliable storage, including that erasure coding is used to protect user data at the chunk level. However, chunks are filled with user data at different rates, whereby in general it is difficult to predict the moment when a given chunk will get sealed. During data writes for a client, the data storage system does not send any acknowledgement to the client until the data is properly protected in a non-volatile memory. Therefore, there is a time window between the moment the user data comes into the system and the moment that the chunk gets sealed so that the chunk's content can be encoded.

During this time window, triple mirroring can be used as a preliminary protection scheme before erasure coding occurs; in other words, delayed erasure coding is implemented. Note that with triple mirroring, three mirror copies of a chunk are stored to different nodes (which can be two complete copies and one composite copy comprising k data fragments). Therefore, with the basic triple mirroring the system can tolerate dual-node failure.

Triple mirroring results in significant internal data traffic. To reduce the internal data traffic, ECS treats large objects (about 128 MB, which is the chunk size or greater) differently. To this end, dedicated chunks are allocated to store such large objects, referred to as "Type-II" chunks, (with regular chunks referred to as "Type-I" chunks). Large objects directly fill one or more of these dedicated Type-II chunks via erasure coding, and thus object creation acknowledgement is not delayed. However, in many user data storage scenarios, such large objects are relatively rare.

BRIEF DESCRIPTION OF THE DRAWINGS

The technology described herein is illustrated by way of example and not limited in the accompanying figures in which like reference numerals indicate similar elements and in which.

DETAILED DESCRIPTION

Figure 1:
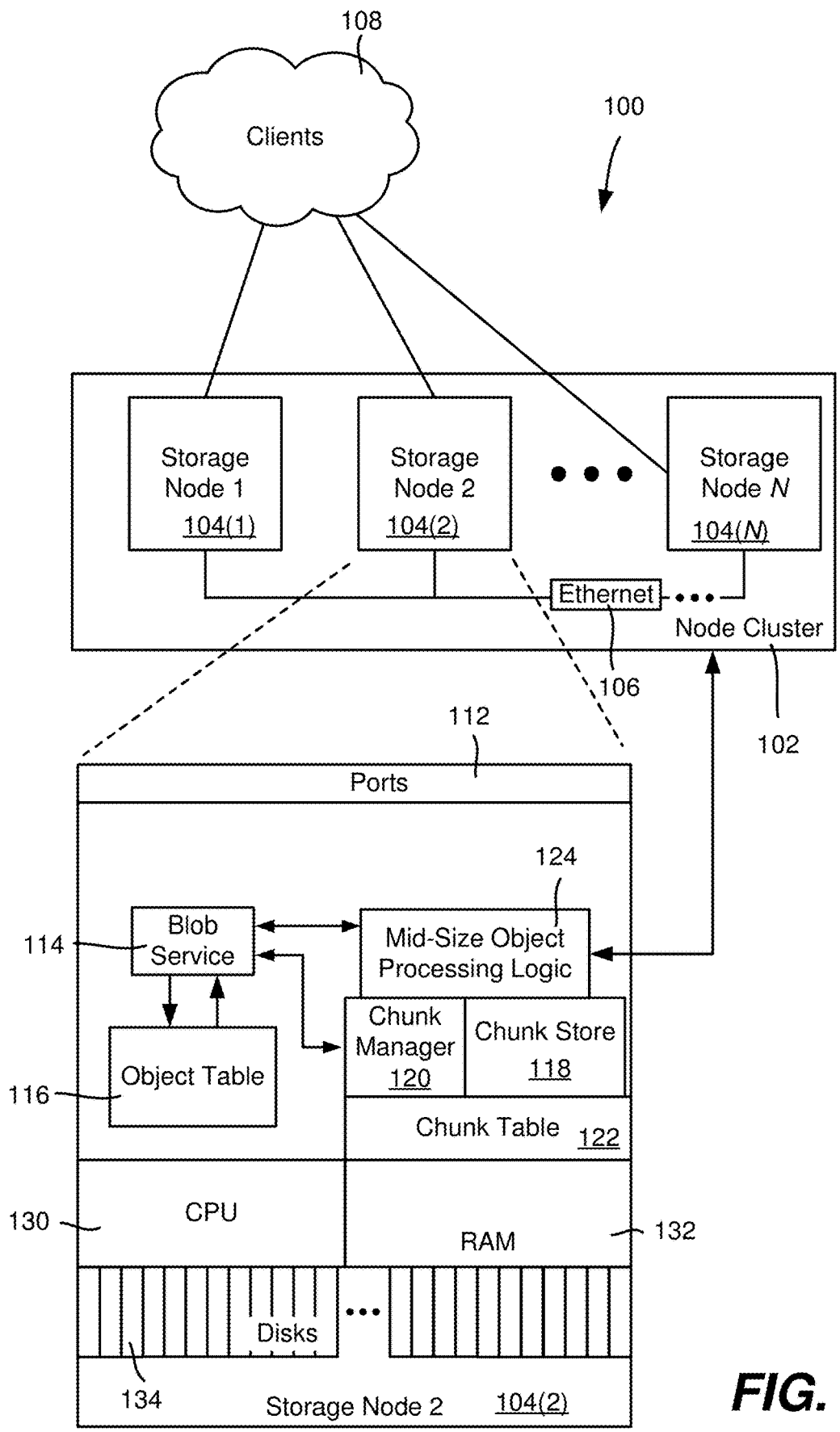
FIG. 1 is an example block diagram representation of part of a data storage system including nodes, including by which mid-size objects can be processed for erasure coded storage without a preliminary protection scheme, in accordance with various aspects and implementations of the subject disclosure.

Various aspects of the technology described herein are generally directed towards directly performing erasure coding to protect data of mid-size objects, without the application of a preliminary protection scheme. The technology is based on the concept that erasure coding can protect data at the chunk level, while encoding can be performed at a lower level, e.g. at the object level. As will be understood, the technology significantly reduces the data traffic that is otherwise produced by a preliminary protection scheme for user data objects being stored in a chunk. As will be further understood, the amount of system metadata can be reduced for such mid-size objects, relative to small objects, for example.

A chunk comprising distributed chunk data fragments and chunk coding fragments is allocated for strong mid-size objects. When a mid-size object is to be created, the object data is dividing into smaller (smaller relative to a chunk fragment size) object data fragments, and erasure encoded into smaller object coding fragments. The divided object data fragments and encoded object coding fragments can be directly written into segments in the chunk data fragments and chunk coding fragments, respectively, that is, without a preliminary protection scheme. Creation of the object is acknowledged upon successful completion of the object data fragment and object coding fragment writes.

The size of a mid-size object can be based on the erasure coding scheme (number of data segments k) and a maximum object segment size. In one or more implementations, a default erasure coding scheme uses k=12 object data fragments and a maximum object segment size s of 2 megabytes (MB), whereby in such an implementation, a mid-size object has a lower size limit of 24 MB. In one or more implementations, such a mid-size object is still below the upper size limits for a large object, which is on the order of 128 MB.

As will be understood, the implementation(s) described herein are non-limiting examples, and variations to the technology can be implemented. For instance, many of the examples herein are based on ECS, however the technology is applicable to any data storage system that has units of data that need to be protected. As another example, although the term "chunk" is used herein to represent any data storage unit or data portion, the term "chunk" is not limited to ECS chunks, but rather represents any data storage unit, such as corresponding to the fragment level or the stripe level in other storage systems. Similarly, a "segment" identified by an "offset" and "size" is used to indicate part of a data chunk/block, although it is understood that other terms that can identify such a sub-unit of storage can be used. As such, any of the embodiments, aspects, concepts, structures, functionalities, implementations and/or examples described herein are non-limiting, and the technology may be used in various ways that provide benefits and advantages in data storage in general.

Reference throughout this specification to "one embodiment," "an embodiment," "one implementation," "an implementation," etc. means that a particular feature, structure, or characteristic described in connection with the embodiment/implementation is included in at least one embodiment/implementation. Thus, the appearances of such a phrase "in one embodiment," "in an implementation," etc. in various places throughout this specification are not necessarily all referring to the same embodiment/implementation. Furthermore, the particular features, structures, or characteristics may be combined in any suitable manner in one or more embodiments/implementations.

Aspects of the subject disclosure will now be described more fully hereinafter with reference to the accompanying drawings in which example components and operations are shown. In the following description, for purposes of explanation, numerous specific details are set forth in order to provide a thorough understanding of the various embodiments. However, the subject disclosure may be embodied in many different forms and should not be construed as limited to the examples set forth herein.

FIG. 1 shows part of a data storage system 100 (such as ECS) comprising a node cluster 102 of storage nodes 104(1)-104(N), in which each node is typically a server configured primarily to serve objects in response to client requests. The nodes 104(1)-104(N) are coupled to each other via a suitable data communications link comprising interfaces and protocols, such as represented in FIG. 1 by Ethernet block 106.

Clients 108 make data system-related requests to the cluster 102, which in general is configured as one large object namespace; there may be on the order of billions of objects maintained in a cluster, for example. To this end, a node such as the node 104(2) (shown enlarged in FIG. 1 as well) generally comprises ports 112 by which clients connect to the cloud storage system. Example ports are provided for requests via various protocols, including but not limited to SMB (server message block), FTP (file transfer protocol), HTTP/HTTPS (hypertext transfer protocol) and NFS (Network File System); further, SSH (secure shell) allows administration-related requests, for example.

Each node, such as the node 104(2), includes an instance of a data storage system; (note however that at least some data service components can be per-cluster, rather than per-node, or possibly per-subgroup of nodes). For example, ECS runs a set of storage services, which together implement storage logic. Services can maintain directory tables for keeping their metadata, which can be implemented as search trees. A blob service 114 maintains an object table 116 (e.g., in various partitions among nodes) that keeps track of objects in the data storage system and generally stores their metadata, including an object's data location information, e.g., chunk identifier (ID) and offset location within a chunk. There is also a "reverse" directory table (maintained by another service) that keeps a per chunk list of objects that have their data in a particular chunk.

FIG. 1 further represents some additional concepts, in that the user data repository of chunks is maintained in a chunk store 118, managed by another storage service referred to as a chunk manager 120. A chunk table 122 maintains metadata about chunks, e.g., as managed by the chunk manager 120. Chunks of user data are protected by erasure coding, forming protection groups; (other types of chunks can be protected in other ways, such as by replication).

As described herein, object processing logic, including mid-size object processing logic 124, operates to distribute data across different nodes of the node cluster 102. To this end, as a mid-size object is created, the object data is written to a chunk. Note that for erasure coded data, the chunk is distributed among multiple nodes/storage devices as described herein.

In FIG. 1, a CPU 130 and RAM 132 are shown for completeness; note that the RAM 130 may comprise at least some non-volatile RAM. The node 104(2) further includes storage devices such as disks 134, comprising hard disk drives and/or solid-state drives, or any other suitable type of storage resource. As can be readily appreciated, components of the data storage system including those described herein can be at various times in any storage device or devices, such as in the RAM 132, in the disks 134, or in a combination of both, for example.

Thus, in ECS implementations, disk space is partitioned into a set of blocks of fixed size called chunks, which in one or more implementations are 128 MB in size. The various types of data, including user data and various types of metadata, are stored in chunks. There are different types of chunks, one type per capacity user. In particular, user data is stored in repository chunks, and chunks can be shared. For instance, one chunk may (and in typical cases does) contain segments of multiple user objects. As described herein, a user data chunk can be distributed among the nodes/storage devices of the node cluster in large chunk data fragments (relative to smaller object data fragments) and large chunk coding fragments, corresponding to erasure coding, so that the chunk data fragments and chunk coding fragments of the chunk are protected against node failure.

With respect to distributing a chunk, some data portion (D) is divided into k chunk data fragments ($D_i$) and m chunk coding fragments ($C_i$). The way the coding is done assures that the system can tolerate loss of any m fragments. The default scheme for ECS is 12+4, i.e. k equals 12 and m equals to 4.

One implementation of ECS uses matrix-based erasure coding, in which k+m object data and coding fragments are a matrix-vector product, where the vector comprises k data fragments. The matrix is a Distribution Matrix of (k+m)×k size. The first k rows of the distribution matrix compile a k×k identity matrix. The bottom m rows of the distributed matrix are referred to as the Coding Matrix. Coefficients can be defined in a variety of ways depending on erasure coding algorithm used.

During encoding, the distribution matrix is multiplied by a vector and produces a product vector containing both the data and the coding fragments. Thus, the encoding process is based on m dot products of the coding matrix with the data. When some fragments are lost, the fragments are restored using a decoding matrix.

Figure 2:
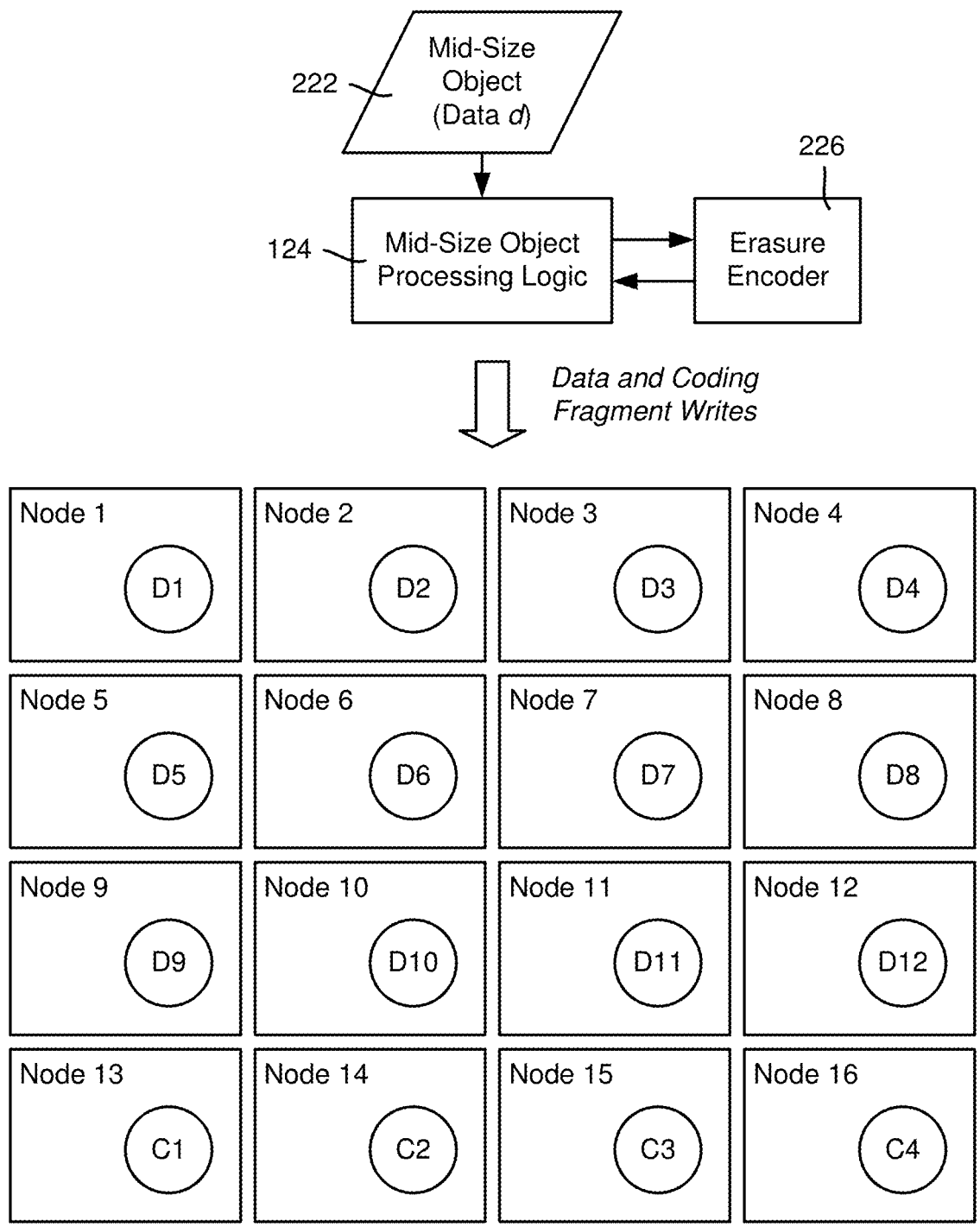
FIG. 2 is an example representation of a cluster of nodes containing chunk data fragments distributed among the nodes, in accordance with various aspects and implementations of the subject disclosure.

Turning to FIG. 2, for mid-size objects, chunks have a specific data layout comprising the chunk data fragments and chunk coding fragments distributed among data storage nodes/storage devices. For purposes of brevity, such chunks can be referred to as Type-III chunks, in contrast to Type-I chunks for small objects (e.g. smaller than 24 MB) and Type-II chunks for large objects (e.g. larger than 128 MB).

As set forth above, in one or more ECS implementations the default encoding scheme for is 12+4, that is, k equals to 12 and m equals to 4. This 12+4 protection scheme is used in the following examples, in which there are 16 total chunk fragments to be stored on 16 nodes (FIG. 2) or on 8 nodes (FIG. 3) and. It is understood, however, that the technology described herein is applicable to different k+m encoding schemes and to clusters having different numbers of nodes.

FIG. 2 shows one ideal data layout, in which there are (at least) 16 nodes for the 16 chunk data fragments and chunk coding fragments to be stored. Each node contains only one chunk fragment.

Figure 3:
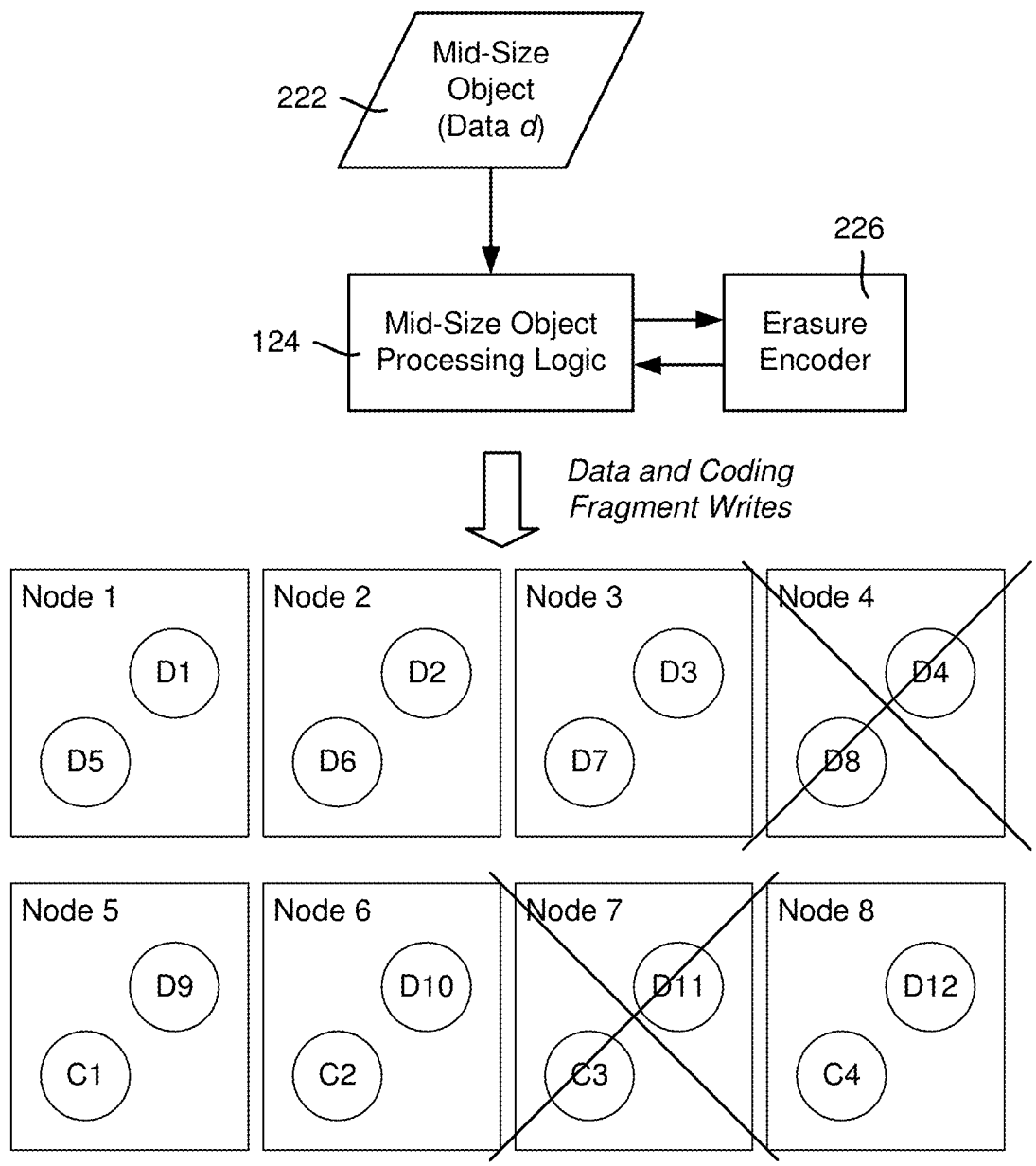
FIG. 3 is an example representation of a cluster of nodes, in which two nodes have failed but the erasure coded mid-size object data can be recovered, in accordance with various aspects and implementations of the subject disclosure.

Note that as shown in the eight node cluster of FIG. 3, a cluster may have fewer nodes, in which event one node may contain two or more chunk fragments; (multiple chunk fragments on a node can be distributed to different storage devices on the node for further protection; indeed, the technology described herein increases system tolerance to any kind of hardware failures, e.g. disk failures as well as node failures). However, as is known with erasure coding, the distribution is such that node failure is still tolerated; for example, in FIG. 3 the node 4 and the node 7 have failed, yet the distributed chunk's data can be reconstructed from the remaining chunk fragments. More particularly, erasure coding calculates coding (e.g., parity) fragments for the chunk, which are also written to different distributed nodes (and disks thereof) as described herein. This ensures that the chunk fragments of a chunk, including the chunk coding fragments, are written to different nodes/disks to help protect against failure.

Returning to FIG. 2, Type-III chunks have a specific data layout. When a new chunk is created the system creates the final chunk fragment layout for that chunk; the set of fragments is complete. In the example of FIG. 2, there are k (e.g., k=12 in FIG. 2) sets of chunk data fragments $D_1, \ldots, D_k$ and m=4 sets of chunk coding fragments $C_1, \ldots, C_m$; note that uppercase D and C represent the distributed chunk data fragments and chunk coding fragments, respectively. Initially, the various chunk fragments are empty. More particularly, with a 128 MB chunk size, the size of each chunk fragment is 128 MB/k, and the chunk fragments initially contain garbage or zeroes, depending on the particular embodiment.

When a mid-size object 222 comes to the system, the object gets encoded without a delay. The object 222 is processed by the mid-size object processing logic 124, by dividing the object data (d) into k smaller object data fragments $d_1, \ldots, d_k$; note that lowercase d is used to represent the object data/divided object data fragments, and similarly lowercase c is used to represent the object coding fragments produced for the object's data.

Thus, as part of the processing by the mid-size object processing logic 124, direct (without delay) encoding is performed. In the example of FIG. 2, mid-size object processing logic 124 is coupled to or incorporates an erasure encoder 226. The encoding processing produces m smaller object coding fragments $c_1, \ldots, c_m$.

The smaller object fragments are persisted to the distributed chunk storage using the chunk fragment layout created for the chunk. The smaller object data fragments are appended to the chunk data fragments at a next offset location in the distributed chunk space: $d_1$ to $D_1, \ldots, d_k$ to $D_k$; (for a new chunk, the initial offset location can be zero). The smaller object coding fragments are appended to the chunk coding fragments: $c_1$ to $C_1, \ldots, c_m$ to $C_m$. Note that in one implementation, for any mid-size object, the offset location within the chunk fragment space for each object data fragment and object coding fragment are the same in each chunk fragment.

To summarize, the chunk fragments created for the chunk are used as containers for the smaller, divided object data fragments or the object coding fragments created for an object. In particular, each chunk fragment contains the smaller object fragments of the (typically multiple) mid-size objects stored within the chunk. Once encoded and stored, the object creation is acknowledged.

Once the object is written to the object data fragments and object coding fragments, additional objects can be written (appended) to the same chunk fragments until the chunk is deemed sufficiently full (e.g., contains approximately 128 MB of data or some other threshold percentage thereof) or after a predefined time, typically whichever occurs first. In this way, when the chunk becomes full enough, the chunk gets sealed. No additional computations or data traffic are triggered on this event.

It should be noted that the final data layout within the chunk fragment layout is transparent from an erasure coding point of view. If decoding is needed, decoding can be done at the chunk level; the fact that encoding was done at the object segment level is irrelevant. With respect to decoding, there is no difference for Type-I, Type-II, or Type-III chunks.

In another aspect, although a mid-size object may be divided into k smaller object data fragments, there is no need in additional system metadata to describe actual data layout. Chunk data fragments have regular structure. A chunk data fragment $D_i$ typically contains many small object fragments, and for any small object fragment $d_i$ therein, the $d_i$-s for one object have the same size. Therefore, a single offset location value within a chunk or a chunk data fragment is can be used by the system needs to address an object. In this way, the actual amount of system metadata can be reduced, as there is no need to store location information for the individual distributed object segments of a mid-size object.

Figure 4:
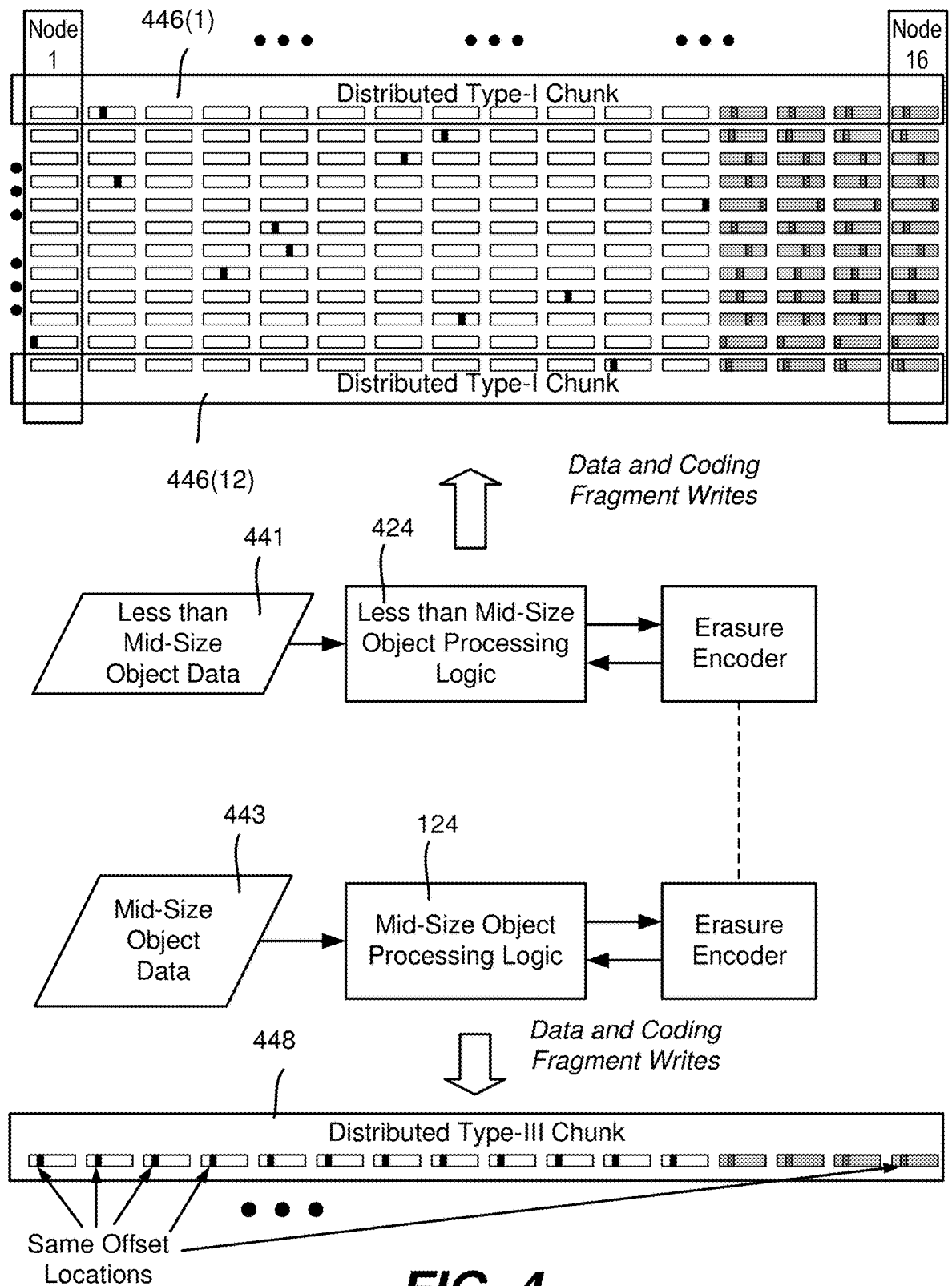
FIG. 4 is an example representation of how a mid-sized data object can be written to a single distributed chunk's data fragments and coding fragments (in contrast to a small-sized data object), in accordance with various aspects and implementations of the subject disclosure FIGS. 5 and 6 comprise a flow diagram representation of example operations related to processing a mid-size object to be created and stored, in accordance with various aspects and implementations of the subject disclosure.

By way of example, FIG. 4 shows two objects, one being a mid-size 24 MB data object 443 (to store to a Type-III chunk) and the other being a smaller data object 441 (to store to a Type-I chunk), that is, the smaller object is less than 24

MB, such as 24 MB–1. Note that without the mid-size object processing logic 124 as described herein, any other object that is less than the size of a Type-II (e.g., 128 MB) object would be stored to a Type-I chunk.

Thus, the small object 441 is stored as twelve [(24 MB–1)/2 MB] segments in up to twelve Type-I chunks 446(1)-446 (12). Note that in FIG. 4 the nodes are arranged in columns and the chunks in rows. The four chunk data fragments are shown as unshaded, with the object data fragments shown as segments within the chunk data fragments. In contrast, the four chunk coding fragments are shown as shaded, with the object coding fragments shown as segments within the shaded chunk coding fragments. Note that because other small objects are typically within Type-I chunks, including those less than 2 MB, the offsets for the various object fragments are typically not all the same in Type-I chunks.

With the technology described herein, for the 24 MB object 443, the twelve data segments are stored to different chunk data fragments of one Type-III chunk 448. The object can be directly protected with erasure coding, that is, without a preliminary protection scheme. Indeed, once the object data fragments and object coding fragments have been written, the chunk is protected by erasure coding, which provides higher levels of availability than triple mirroring, for example.

As set forth above, for a mid-size object, the offset locations for each object data fragment and object coding fragment within the chunk fragments of a distributed chunk are the same. Thus reduces system metadata. By way of example, consider storing a 24 MB object. Without mid-size object processing as described herein, the object would be stored like a small object, namely as a set of twelve 2 MB segments to different chunks, in which event for each segment, a chunk ID and the offset location within that chunk need to be stored, that is, twelve chunk IDs and twelve offset location values would need to be stored as system metadata. Instead, with the mid-size object processing of the technology described herein, a mid-size object (normally) resides in a single Type-III chunk, with only one chunk ID. Because the object segments have the same offset locations within the Type-III chunk data fragments, only the chunk ID and offset location value within the chunk (the same within each chunk fragment) can be used to access the object's data.

Notwithstanding, it should be noted that Type-III chunks can be used for storing smaller data objects as well. However, manipulation of "too-small" data portions may be inefficient. With mid-size objects, the size of each smaller object data/coding fragment is at least s (e.g. s=2 MB), which is an appropriate size in one or more implementations.

Note that the differentiation between chunk types, Type-I, Type-II, and Type-III, can be directed to chunks that accommodate only new objects. The differentiation may not be needed, for example, when a copying garbage collector copies live data from Type-I, Type-II, and/or Type-III chunks to destination chunk(s).

It also should be noted that the technology described herein is based on reading from the object segments across the distributed chunk data fragments for Type-III data reads. However, only rather small objects (e.g., less than 2 MB in size) can fit into a single segment of a Type-I chunk. Without the technology described herein, a mid-size object would normally comprise a set of 2 MB segments stored to (on the order of ten) different Type-I chunks, whereby a mid-size object is already segmented and thus already has to be read from different locations, so there is no significant inefficiencies with having such multiple object data fragment reads. A significant advantage is that by segmenting a mid-size object as described herein into a different type of (a Type-III) chunk data structure, a preliminary protection scheme need not be used.

Without a preliminary protection scheme, the technology described herein eliminates a significant amount of data traffic and significantly reduces storage device (e.g., disk) I/O within the system. For example, in one implementation 384 MB of traffic (3*128 MB to store two redundant chunk copies and read one copy back to perform encoding) would exist with a preliminary protection scheme for each chunk with user data. In such an implementation, the total additional traffic produced by the erasure coding implementation for mid-size objects is 0.33*chunk_size (to write four coding fragments), which is very small compared to the 3.33*chunk_size produced by the current erasure coding implementation for a mid-size object (to write two mirror copies, read one copy, and write four coding fragments).

Figure 5:
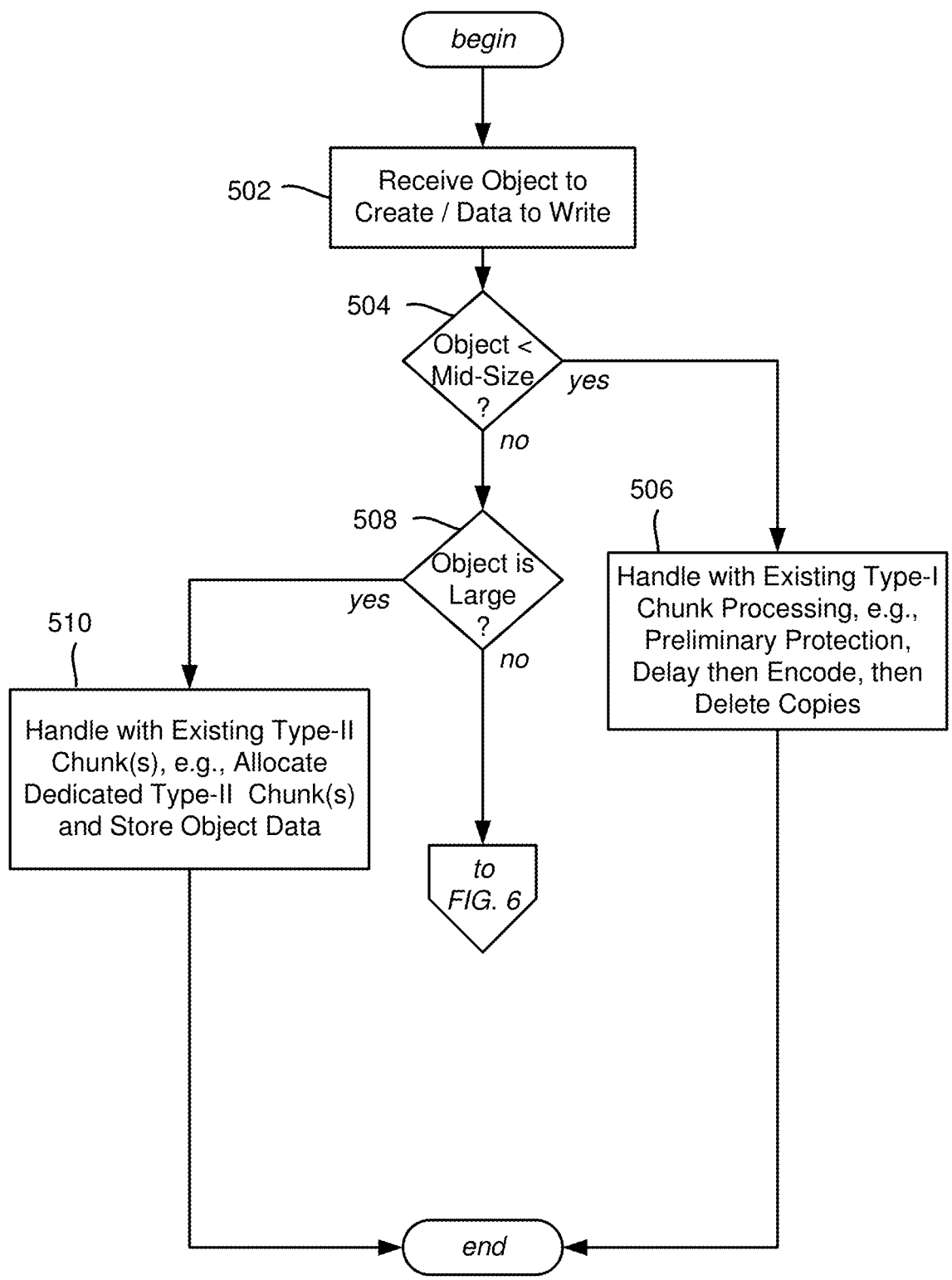
Figure 6:
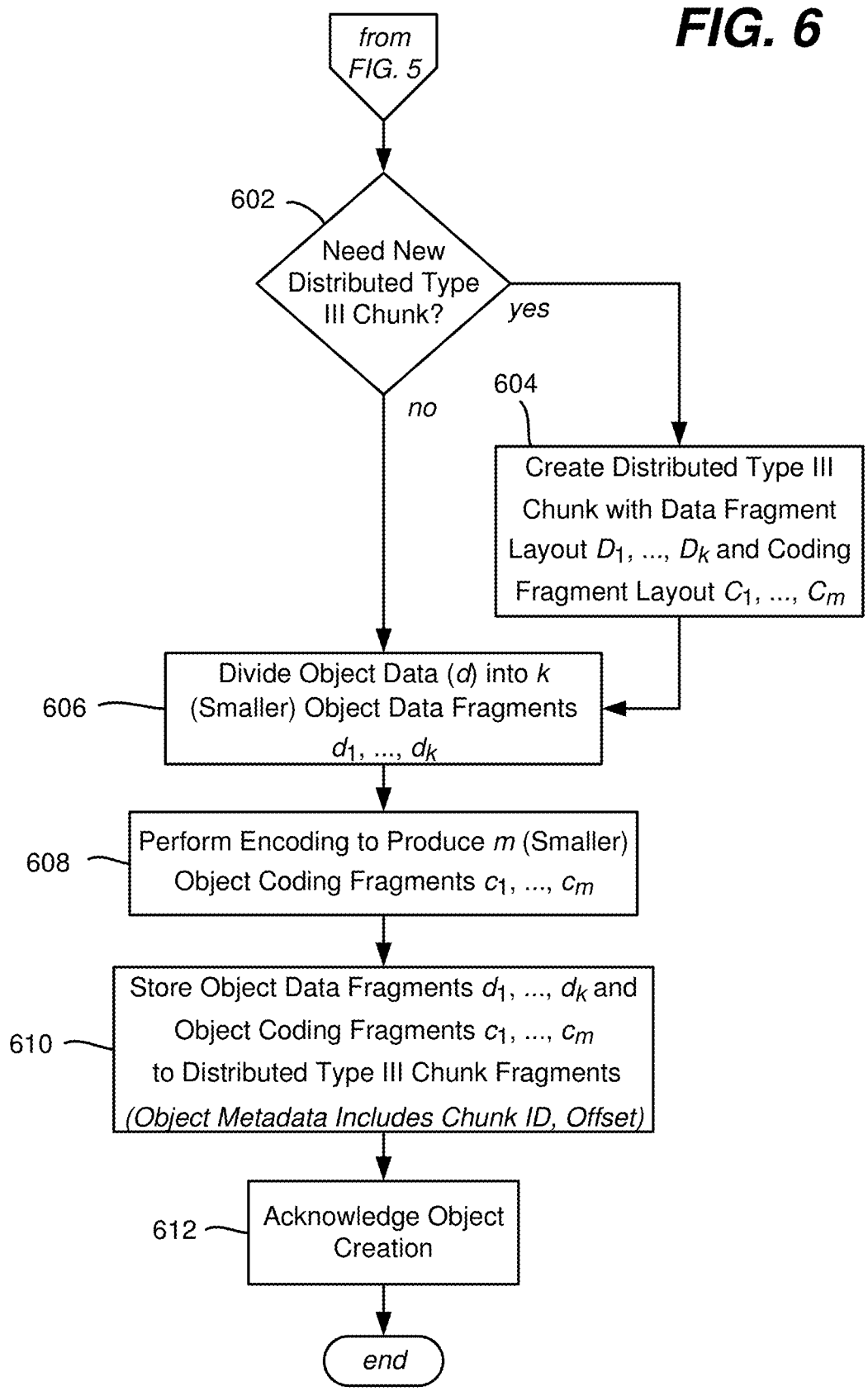

FIGS. 5 and 6 comprise a flow diagram showing example operations for handling object creation, when an object to create and its object data to write is received, as represented by operation 502. Operation 504 represents evaluating the object's size to determine whether the object is a small object (below the size of a mid-size object). If so, operation 506 handles the object creation and write processing to a Type-I chunk as generally described herein, e.g., using a preliminary protection scheme, with a delay until chunk encoding can occur, at which time the no-longer-needed mirror copies can be deleted.

If not a small object, operation 508 represents evaluating the object's size to determine whether the object is a large object, e.g., at the chunk size, approaching the chunk size to a closeness size threshold, or greater than the chunk size. If so, operation 510 handles the object by storing the object data in one or more Type-II chunks as generally described herein.

If not a small or large object, the object is a mid-size object as described herein, and can be processed as such using the example operations of FIG. 6. Operation 602 represents evaluating whether a new Type-III chunk is needed for this object. If so, operation 604 performs the chunk creation and chunk data fragment and chunk coding fragment layout as described herein. Note that it is feasible to create a new Type-III chunk in advance, before a mid-size object needs to be created, such as when the previous (if any) Type-III chunk has been sealed.

In any event, operation 606 divides the object data into the k smaller (relative to the chunk data fragments D) data fragments $d_1, \ldots, d_k$ as described herein. Operation 608 performs the encoding operation to produce the m smaller (relative to the larger chunk coding fragments C) coding fragments $c_1, \ldots, c_m$.

Operation 610 represents storing the smaller object data fragments and object coding fragments to the distributed Type-III chunk fragments. As described herein, the object metadata can include only a single chunk ID and offset location value.

When the object data fragments and object coding fragments are stored in conjunction with saving the appropriate object metadata, operation 612 acknowledges the object creation. Although not explicitly shown in FIG. 6, it is understood that the storing operation 610 may have filled the chunk to the point where the chunk can be sealed. Otherwise, there is still space in the Type-III chunk's fragments, for the next new mid-size object (its data and coding fragments) to be appended to the Type-III chunk.

Figure 7:
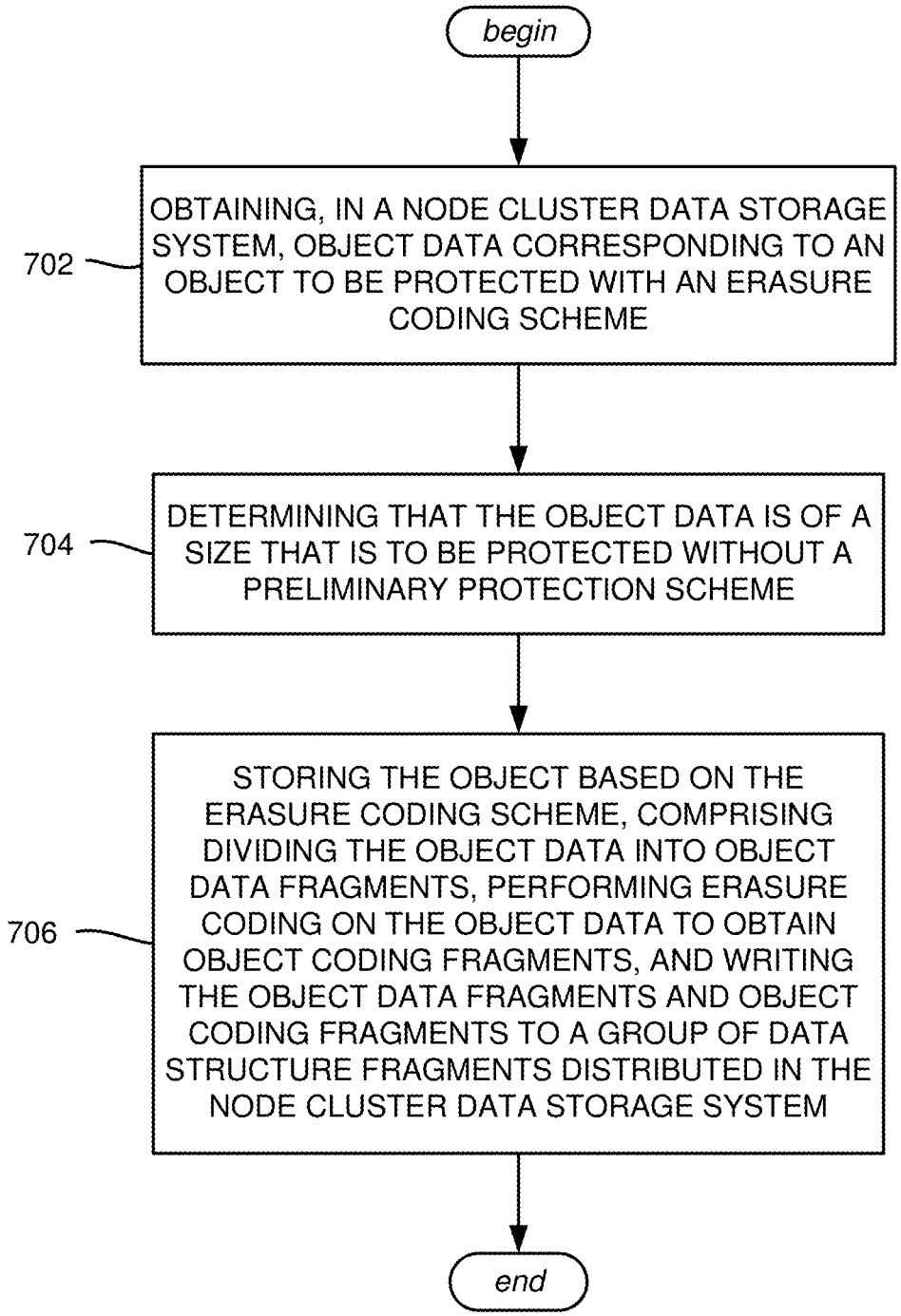
FIG. 7 is a flow diagram representation of example operations related to storing a mid-size object's data using direct erasure coding and without a preliminary protection scheme, in accordance with various aspects and implementations of the subject disclosure.

One or more aspects are represented in FIG. 7, and for example can be a system, comprising a processor, and a memory that stores executable instructions that, when executed by the processor, facilitate performance of operations. Example operations can comprise operation 702, which represents obtaining, in a node cluster data storage system, object data corresponding to an object to be protected with an erasure coding scheme. Operation 704 represents determining that the object data is of a size that is to be protected without a preliminary protection scheme. Operation 706 represents storing the object based on the erasure coding scheme, comprising dividing the object data into object data fragments, performing erasure coding on the object data to obtain object coding fragments, and writing the object data fragments and object coding fragments to a group of data structure fragments distributed in the node cluster data storage system.

The object to be protected can be a new object to be created, and further operations can comprise acknowledging creation of the new object after storing the object.

Further operations can comprise pre-allocating the (e.g., chunk) group of data structure fragments.

Determining that the object data is of the size that is to be protected without the preliminary protection scheme can comprise determining that the object data is of the size that is greater than or equal to a defined lower size limit.

The defined lower size limit can be based on a defined segment size multiplied by a value representing a total number of the object data fragments. The defined segment size can be two megabytes and the number of object data fragments can be twelve.

Determining that the object data is of the size that is to be protected without the preliminary protection scheme can comprise determining that the object data is of the size that is less than a defined upper size limit.

The defined upper size limit can be based on a chunk size of a chunk data structure corresponding to the group of data structure fragments.

The erasure coding scheme can correspond to a division of the object data into twelve object data fragments and an encoding of four object coding fragments.

The group of data structure fragment can be associated with a distributed chunk data structure in the node cluster data storage system, and writing the object data fragments to the group of data structure fragments can comprise writing the object data fragments to a same offset location within the distributed chunk data structure.

Figure 8:
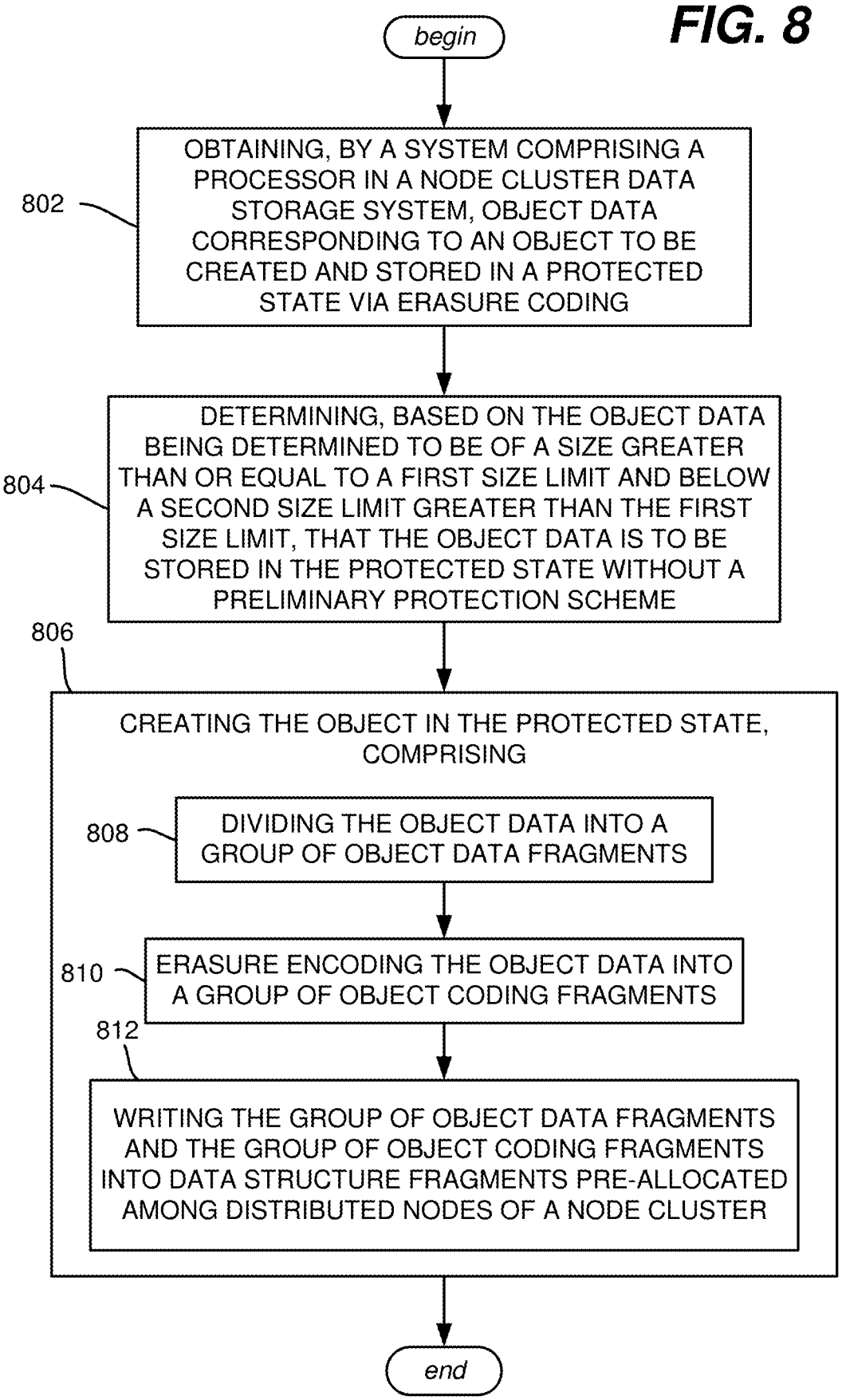
FIG. 8 is a flow diagram representation of example operations related to creating a mid-size data object and storing the mid-size object's data using direct erasure coding and without a preliminary protection scheme, in accordance with various aspects and implementations of the subject disclosure.

One or more example aspects are represented in FIG. 8, and can correspond to operations of a method, for example. Example operations comprise operation 802, which represents obtaining, by a system comprising a processor in a node cluster data storage system, object data corresponding to an object to be created and stored in a protected state via erasure coding. Operation 804 represents determining, based on the object data being determined to be of a size greater than or equal to a first size limit and below a second size limit greater than the first size limit, that the object data is to be stored in the protected state without a preliminary protection scheme. Operation 806 represents creating the object in the protected state, comprising dividing the object data into a group of object data fragments (operation 808), erasure encoding the object data into a group of object coding fragments (operation 810) and writing the group of object data fragments and the group of object coding fragments into data structure fragments pre-allocated among distributed nodes of a node cluster (operation 812).

Writing the group of object data fragments and the group of object coding fragments to the group of data structure fragments can comprise writing respective object data fragments and object coding fragments to same offset locations in a distributed chunk data structure.

The group of object data fragments can comprise twelve object data fragments, the group of object coding fragments can comprise four object coding fragments, and writing the group of object data fragments and the group of object coding fragments can comprise writing the group of object data fragments and the group of object coding fragments into sixteen data structure fragments in a pre-allocated chunk data structure distributed among the distributed nodes of the node cluster.

Determining, based on the object data being determined to be of the size greater than or equal to the first size limit and below the second size limit, that the object data is to be stored in the protected state without the preliminary protection scheme can comprise determining that the size of the object data is greater than or equal to twenty-four megabytes and is less than one-hundred twenty-eight megabytes.

Aspects can comprise acknowledging creation of the object after writing the group of object data fragments and the group of object coding fragments into the data structure fragments.

The data structure fragments can correspond to a distributed chunk data structure; aspects can comprise sealing the distributed chunk data structure in response to determining that the distributed chunk data structure has entered a threshold fullness state.

Figure 9:
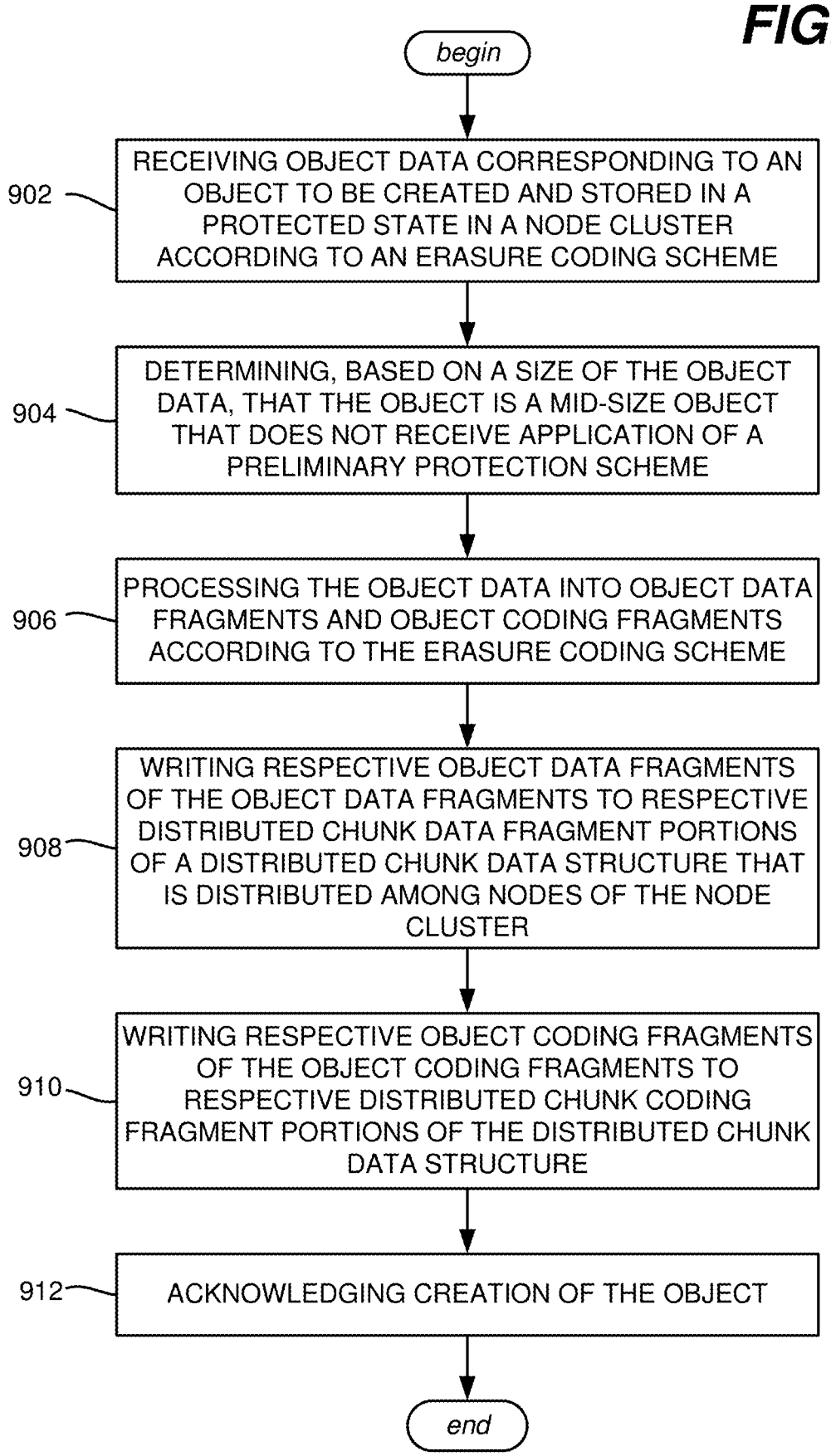
FIG. 9 is a flow diagram representation of example operations related to storing a mid-size object's data using direct erasure coding and without the application of a preliminary protection scheme, in accordance with various aspects and implementations of the subject disclosure.

One or more aspects, such as implemented in a machine-readable storage medium, comprising executable instructions that, when executed by a processor, facilitate performance of operations, can be directed towards operations exemplified in FIG. 9. Operation 902 represents receiving object data corresponding to an object to be created and stored in a protected state in a node cluster according to an erasure coding scheme. Operation 904 represents determining, based on a size of the object data, that the object is a mid-size object that does not receive application of a preliminary protection scheme. Operation 906 represents processing the object data into object data fragments and object coding fragments according to the erasure coding scheme. Operation 908 represents writing respective object data fragments of the object data fragments to respective distributed chunk data fragment portions of a distributed chunk data structure that is distributed among nodes of the node cluster. Operation 910 represents writing respective object coding fragments of the object coding fragments to respective distributed chunk coding fragment portions of the distributed chunk data structure. Operation 912 represents acknowledging creation of the object.

The respective distributed chunk data fragment portions and the respective distributed chunk coding fragment portions can have a same offset location in the distributed chunk data structure.

Further operations can comprise maintaining a chunk data structure identifier in association with an offset value representing the same offset location.

Processing the object data into the object data fragments and the object coding fragments according to the erasure coding scheme can comprise dividing the object data into twelve object data fragments and encoding the object data into four object coding fragments.

As can be seen, described herein is a technology that facilitates storing mid-size data objects that are protected with erasure coding, without the need for applying a preliminary protection scheme. The technology reduces data traffic storage device (e.g., disk) I/O within a storage system but does not compromise on data availability. The direct erasure coding avoids the data network traffic associated with preliminary protection schemes.

Figure 10:
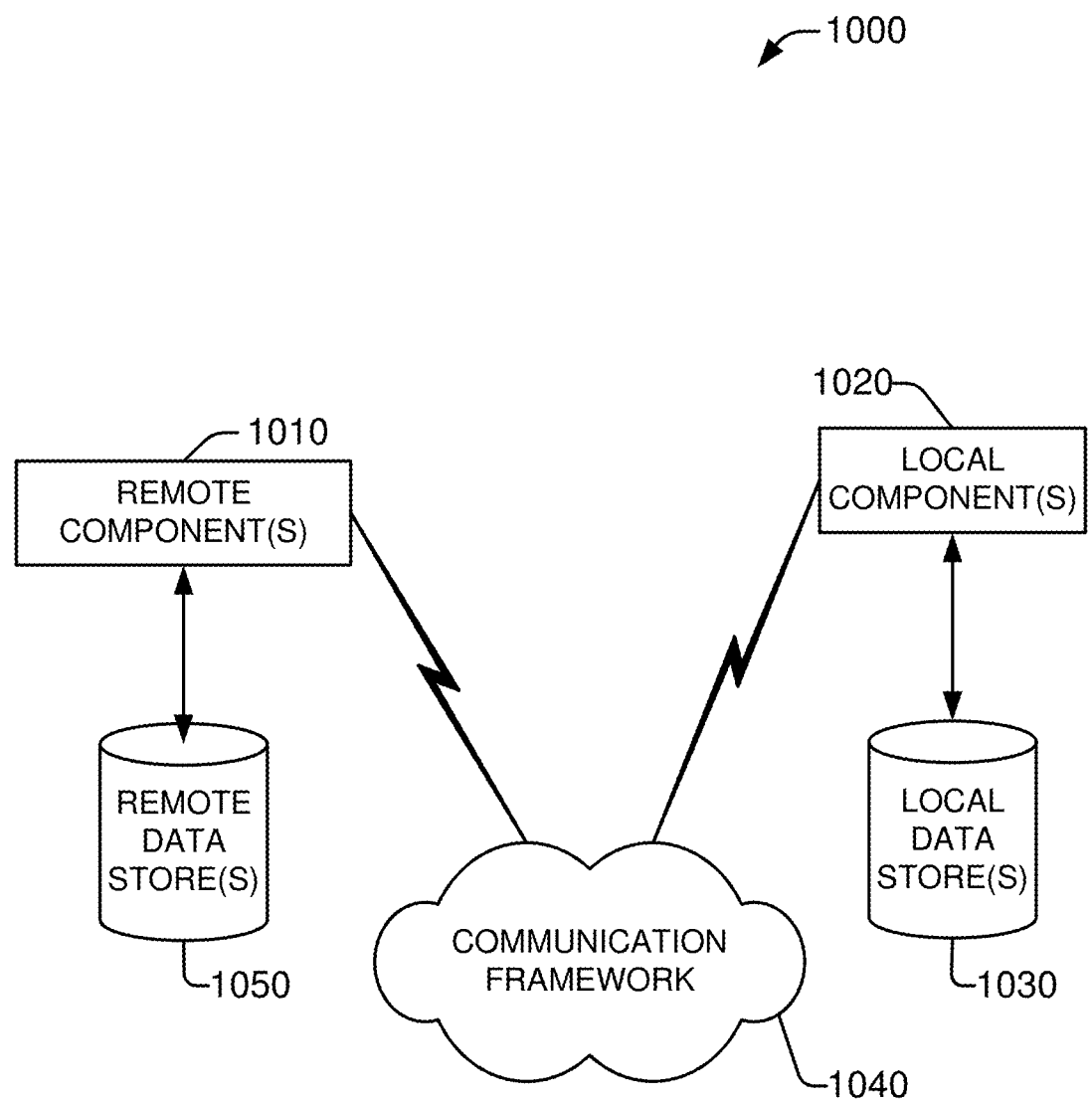
FIG. 10 depicts an example schematic block diagram of a computing environment with which the disclosed subject matter can interact, in accordance with various aspects and implementations of the subject disclosure.

FIG. 10 is a schematic block diagram of a computing environment 1000 with which the disclosed subject matter can interact. The system 1000 comprises one or more remote component(s) 1010. The remote component(s) 1010 can be hardware and/or software (e.g., threads, processes, computing devices). In some embodiments, remote component(s) 1010 can be a distributed computer system, connected to a local automatic scaling component and/or programs that use the resources of a distributed computer system, via communication framework 1040. Communication framework 1040 can comprise wired network devices, wireless network devices, mobile devices, wearable devices, radio access network devices, gateway devices, femtocell devices, servers, etc.

The system 1000 also comprises one or more local component(s) 1020. The local component(s) 1020 can be hardware and/or software (e.g., threads, processes, computing devices). In some embodiments, local component(s) 1020 can comprise an automatic scaling component and/or programs that communicate/use the remote resources 1010 and 1020, etc., connected to a remotely located distributed computing system via communication framework 1040.

One possible communication between a remote component(s) 1010 and a local component(s) 1020 can be in the form of a data packet adapted to be transmitted between two or more computer processes. Another possible communication between a remote component(s) 1010 and a local component(s) 1020 can be in the form of circuit-switched data adapted to be transmitted between two or more computer processes in radio time slots. The system 1000 comprises a communication framework 1040 that can be employed to facilitate communications between the remote component(s) 1010 and the local component(s) 1020, and can comprise an air interface, e.g., Uu interface of a UMTS network, via a long-term evolution (LTE) network, etc. Remote component(s) 1010 can be operably connected to one or more remote data store(s) 1050, such as a hard drive, solid state drive, SIM card, device memory, etc., that can be employed to store information on the remote component(s) 1010 side of communication framework 1040. Similarly, local component(s) 1020 can be operably connected to one or more local data store(s) 1030, that can be employed to store information on the local component(s) 1020 side of communication framework 1040.

Figure 11:
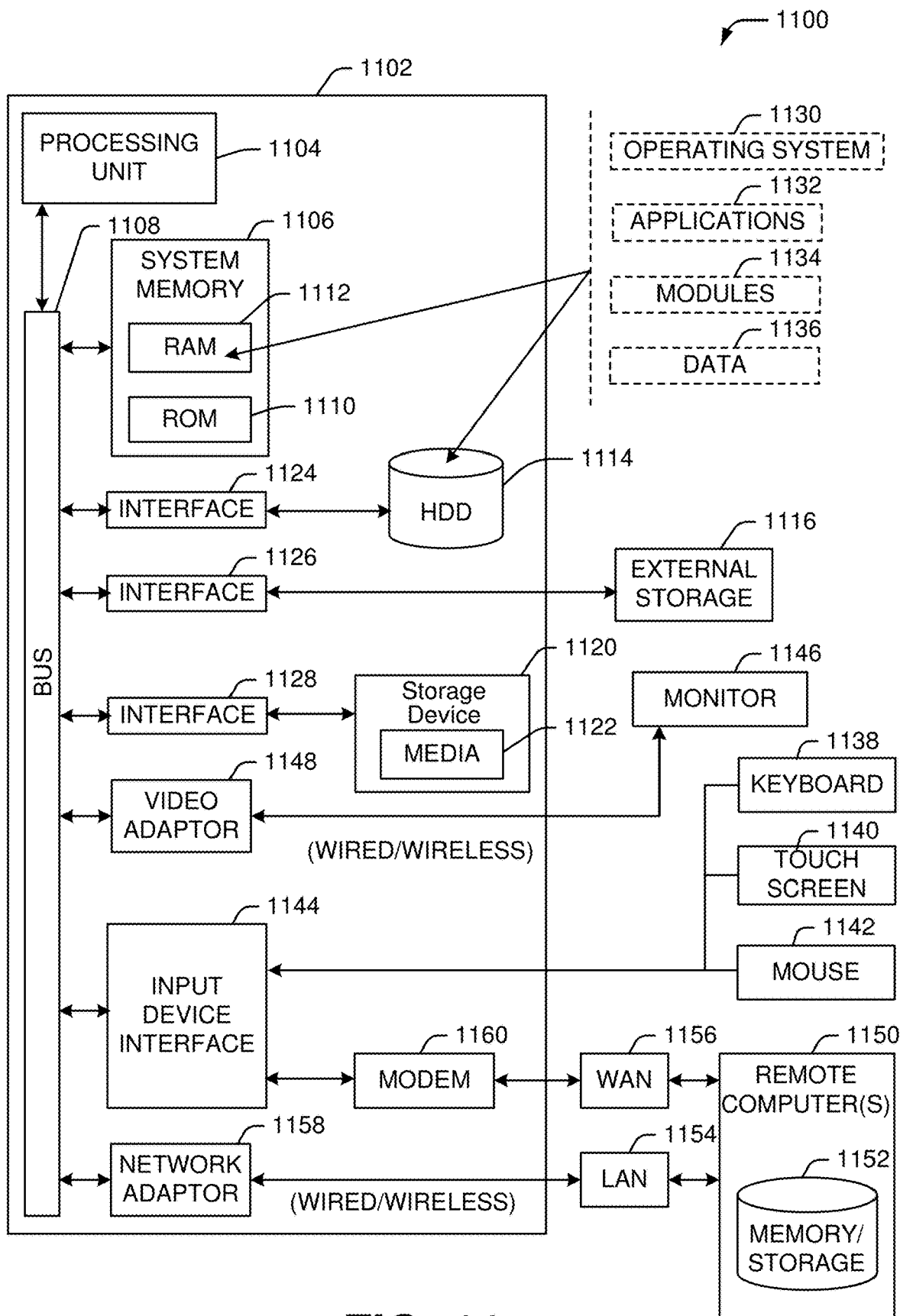
FIG. 11 illustrates an example block diagram of a computing system operable to execute the disclosed systems and methods in accordance with various aspects and implementations of the subject disclosure.

In order to provide additional context for various embodiments described herein, FIG. 11 and the following discussion are intended to provide a brief, general description of a suitable computing environment 1100 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 11, the example environment 1100 for implementing various embodiments of the aspects described herein includes a computer 1102, the computer 1102 including a processing unit 1104, a system memory 1106 and a system bus 1108. The system bus 1108 couples system components including, but not limited to, the system memory 1106 to the processing unit 1104. The processing unit 1104 can be any of various commercially available processors. Dual microprocessors and other multi-processor architectures can also be employed as the processing unit 1104.

The system bus 1108 can be any of several types of bus structure that can further interconnect to a memory bus (with or without a memory controller), a peripheral bus, and a local bus using any of a variety of commercially available bus architectures. The system memory 1106 includes ROM 1110 and RAM 1112. A basic input/output system (BIOS) can be stored in a non-volatile memory such as ROM, erasable programmable read only memory (EPROM), EEPROM, which BIOS contains the basic routines that help to transfer information between elements within the computer 1102, such as during startup. The RAM 1112 can also include a high-speed RAM such as static RAM for caching data.

The computer 1102 further includes an internal hard disk drive (HDD) 1114 (e.g., EIDE, SATA), and can include one or more external storage devices 1116 (e.g., a magnetic floppy disk drive (FDD) 1116, a memory stick or flash drive reader, a memory card reader, etc.). While the internal HDD 1114 is illustrated as located within the computer 1102, the internal HDD 1114 can also be configured for external use in a suitable chassis (not shown). Additionally, while not shown in environment 1100, a solid state drive (SSD) could be used in addition to, or in place of, an HDD 1114.

Other internal or external storage can include at least one other storage device 1120 with storage media 1122 (e.g., a solid state storage device, a nonvolatile memory device, and/or an optical disk drive that can read or write from removable media such as a CD-ROM disc, a DVD, a BD, etc.). The external storage 1116 can be facilitated by a network virtual machine. The HDD 1114, external storage device(s) 1116 and storage device (e.g., drive) 1120 can be connected to the system bus 1108 by an HDD interface 1124, an external storage interface 1126 and a drive interface 1128, respectively.

The drives and their associated computer-readable storage media provide nonvolatile storage of data, data structures, computer-executable instructions, and so forth. For the computer 1102, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1112, including an operating system 1130, one or more application programs 1132, other program modules 1134 and program data 1136. All or portions of the operating system, applications, modules, and/or data can also be cached in the RAM 1112. The systems and methods described herein can be implemented utilizing various commercially available operating systems or combinations of operating systems.

Computer 1102 can optionally comprise emulation technologies. For example, a hypervisor (not shown) or other intermediary can emulate a hardware environment for operating system 1130, and the emulated hardware can optionally be different from the hardware illustrated in FIG. 11. In such an embodiment, operating system 1130 can comprise one virtual machine (VM) of multiple VMs hosted at computer 1102. Furthermore, operating system 1130 can provide runtime environments, such as the Java runtime environment or the .NET framework, for applications 1132. Runtime environments are consistent execution environments that allow applications 1132 to run on any operating system that includes the runtime environment. Similarly, operating system 1130 can support containers, and applications 1132 can be in the form of containers, which are lightweight, standalone, executable packages of software that include, e.g., code, runtime, system tools, system libraries and settings for an application.

Further, computer 1102 can be enable with a security module, such as a trusted processing module (TPM). For instance with a TPM, boot components hash next in time boot components, and wait for a match of results to secured values, before loading a next boot component. This process can take place at any layer in the code execution stack of computer 1102, e.g., applied at the application execution level or at the operating system (OS) kernel level, thereby enabling security at any level of code execution.

A user can enter commands and information into the computer 1102 through one or more wired/wireless input devices, e.g., a keyboard 1138, a touch screen 1140, and a pointing device, such as a mouse 1142. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1104 through an input device interface 1144 that can be coupled to the system bus 1108, but can be connected by other interfaces, such as a parallel port, an IEEE 1394 serial port, a game port, a USB port, an IR interface, a BLUETOOTH® interface, etc.

A monitor 1146 or other type of display device can be also connected to the system bus 1108 via an interface, such as a video adapter 1148. In addition to the monitor 1146, a computer typically includes other peripheral output devices (not shown), such as speakers, printers, etc.

The computer 1102 can operate in a networked environment using logical connections via wired and/or wireless communications to one or more remote computers, such as a remote computer(s) 1150. The remote computer(s) 1150 can be a workstation, a server computer, a router, a personal computer, portable computer, microprocessor-based entertainment appliance, a peer device or other common network node, and typically includes many or all of the elements described relative to the computer 1102, although, for purposes of brevity, only a memory/storage device 1152 is illustrated. The logical connections depicted include wired/wireless connectivity to a local area network (LAN) 1154 and/or larger networks, e.g., a wide area network (WAN) 1156. Such LAN and WAN networking environments are commonplace in offices and companies, and facilitate enterprise-wide computer networks, such as intranets, all of which can connect to a global communications network, e.g., the Internet.

When used in a LAN networking environment, the computer 1102 can be connected to the local network 1154 through a wired and/or wireless communication network interface or adapter 1158. The adapter 1158 can facilitate wired or wireless communication to the LAN 1154, which can also include a wireless access point (AP) disposed thereon for communicating with the adapter 1158 in a wireless mode.

When used in a WAN networking environment, the computer 1102 can include a modem 1160 or can be connected to a communications server on the WAN 1156 via other means for establishing communications over the WAN 1156, such as by way of the Internet. The modem 1160, which can be internal or external and a wired or wireless device, can be connected to the system bus 1108 via the input device interface 1144. In a networked environment, program modules depicted relative to the computer 1102 or portions thereof, can be stored in the remote memory/storage device 1152. It will be appreciated that the network connections shown are example and other means of establishing a communications link between the computers can be used.

When used in either a LAN or WAN networking environment, the computer 1102 can access cloud storage systems or other network-based storage systems in addition to, or in place of, external storage devices 1116 as described above. Generally, a connection between the computer 1102 and a cloud storage system can be established over a LAN 1154 or WAN 1156 e.g., by the adapter 1158 or modem 1160, respectively. Upon connecting the computer 1102 to an associated cloud storage system, the external storage interface 1126 can, with the aid of the adapter 1158 and/or modem 1160, manage storage provided by the cloud storage system as it would other types of external storage. For instance, the external storage interface 1126 can be configured to provide access to cloud storage sources as if those sources were physically connected to the computer 1102.

The computer 1102 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances.

While the embodiments are susceptible to various modifications and alternative constructions, certain illustrated implementations thereof are shown in the drawings and have been described above in detail. It should be understood, however, that there is no intention to limit the various embodiments to the specific forms disclosed, but on the contrary, the intention is to cover all modifications, alternative constructions, and equivalents falling within the spirit and scope.

In addition to the various implementations described herein, it is to be understood that other similar implementations can be used or modifications and additions can be made to the described implementation(s) for performing the same or equivalent function of the corresponding implementation(s) without deviating therefrom. Still further, multiple processing chips or multiple devices can share the performance of one or more functions described herein, and similarly, storage can be effected across a plurality of devices. Accordingly, the various embodiments are not to be limited to any single implementation, but rather is to be construed in breadth, spirit and scope in accordance with the appended claims.

What is claimed is:

1. A system, comprising:
    a processor, and
    a memory that stores executable instructions that, when executed by the processor, facilitate performance of operations, the operations comprising:
        obtaining, in a node cluster data storage system, object data corresponding to an object to be protected with an erasure coding scheme;
        determining that the object data is of a size that is to be protected without a preliminary protection scheme; and
        storing the object based on the erasure coding scheme, comprising dividing the object data into object data fragments, performing erasure coding on the object data to obtain object coding fragments, and writing the object data fragments and the object coding fragments to a group of data structure fragments distributed in the node cluster data storage system, wherein the group of data structure fragments are associated with a distributed chunk data structure in the node cluster data storage system, and wherein storing the object comprises writing the object data fragments to a same offset location within the distributed chunk data structure.

2. The system of claim 1, wherein the object to be protected is a new object to be created, and wherein the operations further comprise:
    acknowledging creation of the new object after storing the new object.

3. The system of claim 1, wherein the operations further comprise:
    pre-allocating the group of data structure fragments.

4. The system of claim 1, wherein the determining that the object data is of the size that is to be protected without the preliminary protection scheme comprises:
    determining that the object data is of the size that is greater than or equal to a defined lower size limit.

5. The system of claim 4, wherein the defined lower size limit is based on a defined segment size multiplied by a value representing a total number of the object data fragments.

6. The system of claim 5, wherein the defined segment size is two megabytes and the number of object data fragments is twelve.

7. The system of claim 1, wherein the determining that the object data is of the size that is to be protected without the preliminary protection scheme comprises:
    determining that the object data is of the size that is less than a defined upper size limit.

8. The system of claim 7, wherein the defined upper size limit is based on a chunk size of a chunk data structure corresponding to the group of data structure fragments.

9. The system of claim 1, wherein the erasure coding scheme corresponds to a division of the object data into twelve object data fragments and an encoding of four object coding fragments.

10. A method, comprising:
    obtaining, by a system comprising a processor in a node cluster data storage system, object data corresponding to an object to be created and stored in a protected state via erasure coding;
    determining, based on the object data being determined to be of a size greater than or equal to a first size limit and below a second size limit greater than the first size limit, that the object data is to be stored in the protected state without a preliminary protection scheme; and
    creating the object in the protected state, comprising:
        dividing the object data into a group of object data fragments;
        erasure encoding the object data into a group of object coding fragments; and
        writing the group of object data fragments and the group of object coding fragments into data structure fragments pre-allocated among distributed nodes of a node cluster, wherein the writing the group of object data fragments and the group of object coding fragments to the data structure fragments comprises writing respective object data fragments and object coding fragments to same offset locations in a distributed chunk data structure.

11. The method of claim 10, wherein the group of object data fragments comprises twelve object data fragments, wherein the group of object coding fragments comprises four object coding fragments, and wherein the writing the group of object data fragments and the group of object coding fragments comprises writing the group of object data fragments and the group of object coding fragments into sixteen data structure fragments of the data structure fragments in a pre-allocated chunk data structure distributed among the distributed nodes of the node cluster.

12. The method of claim 10, wherein the determining, based on the object data being determined to be of the size greater than or equal to the first size limit and below the second size limit, that the object data is to be stored in the protected state without the preliminary protection scheme comprises:
    determining that the size of the object data is greater than or equal to twenty-four megabytes and is less than one-hundred twenty-eight megabytes.

13. The method of claim 10, further comprising:
    acknowledging creation of the object after writing the group of object data fragments and the group of object coding fragments into the data structure fragments.

14. The method of claim 10, further comprising:
    sealing the distributed chunk data structure in response to determining that the distributed chunk data structure has entered a threshold fullness state.

15. A non-transitory machine-readable medium, comprising executable instructions that, when executed by a processor, facilitate performance of operations, the operations comprising:
    receiving object data corresponding to an object to be created and stored in a protected state in a node cluster according to an erasure coding scheme;
    determining, based on a size of the object data, that the object is a mid-size object that does not receive application of a preliminary protection scheme;

processing the object data into object data fragments and object coding fragments according to the erasure coding scheme;

writing respective object data fragments of the object data fragments to respective distributed chunk data fragment portions of a distributed chunk data structure that is distributed among nodes of the node cluster; and writing respective object coding fragments of the object coding fragments to respective distributed chunk coding fragment portions of the distributed chunk data structure, wherein the respective distributed chunk data fragment portions and the respective distributed chunk coding fragment portions have a same offset location in the distributed chunk data structure.

16. The non-transitory machine-readable medium of claim 15, wherein the operations further comprise:

maintaining a chunk data structure identifier in association with an offset value representing the same offset location.

17. The non-transitory machine-readable medium of claim 15, wherein the processing the object data into the object data fragments and the object coding fragments according to the erasure coding scheme comprises:

dividing the object data into twelve object data fragments and encoding the object data into four object coding fragments.

18. The system of claim 1, wherein the operations further comprise:

maintaining a chunk data structure identifier in association with an offset value representing the same offset location.

19. The method of claim 10, further comprising:

maintaining a chunk data structure identifier in association with an offset value representing the same offset location.

20. The non-transitory machine-readable medium of claim 15, wherein the preliminary protection scheme comprises mirroring, and wherein erasure coding is performed on the object.

* * * * *